US012689183B2

(12) United States Patent
Zhu et al.

(10) Patent No.: US 12,689,183 B2
(45) Date of Patent: Jul. 21, 2026

(54) STACKED GRATINGS FOR OPTICAL EMITTERS

(71) Applicant: Lumentum Operations LLC, San Jose, CA (US)

(72) Inventors: Yeyu Zhu, San Jose, CA (US); Chien-Yao Lu, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 895 days.

(21) Appl. No.: 17/935,790

(22) Filed: Sep. 27, 2022

(65) Prior Publication Data
US 2024/0014633 A1      Jan. 11, 2024

Related U.S. Application Data

(60) Provisional application No. 63/367,882, filed on Jul. 7, 2022.

(51) Int. Cl.
*H01S 5/183*          (2006.01)
(52) U.S. Cl.
CPC ...... *H01S 5/18361* (2013.01); *H01S 5/18313* (2013.01); *H01S 5/18319* (2013.01); *H01S 5/18386* (2013.01); *H01S 2304/04* (2013.01)

(58) Field of Classification Search
CPC ............. H01S 5/18361; H01S 5/18313; H01S 5/18319; H01S 5/18386; H01S 2304/04; H01S 5/18347; H01S 2301/176; H01S 5/18311
See application file for complete search history.

(56) References Cited

U.S. PATENT DOCUMENTS

| | | | | |
|---|---|---|---|---|
| 2007/0242715 | A1* | 10/2007 | Gustavsson ......... | H01S 5/18355 372/45.01 |
| 2012/0120977 | A1* | 5/2012 | Fattal .................. | H01S 5/18363 372/50.1 |
| 2019/0252857 | A1* | 8/2019 | Qiao ................... | H01S 5/18355 |
| 2020/0335943 | A1* | 10/2020 | Qiao ................... | H01S 5/18322 |
| 2021/0167580 | A1* | 6/2021 | Qiao .................... | H01S 5/0057 |

* cited by examiner

*Primary Examiner* — Yuanda Zhang
(74) *Attorney, Agent, or Firm* — Harrity & Harrity, LLP

(57) ABSTRACT

Some implementations described herein may provide an optical device. The optical device may include an optical emitter and an optical element aligned to the optical emitter. The optical element may include an oxidation aperture, one or more distributed Bragg reflectors (DBRs) disposed on the oxidation aperture, and a stacked periodic grating structure disposed on the one or more DBRs. The stacked periodic grating structure may include a set of layers. The set of layers may include alternating layers of a first material and a second material. The stacked periodic grating structure may have a selected period, depth, and fill factor that are selected to achieve greater than a threshold level of optical field confinement in a transverse direction of an optical field emitted by the optical emitter.

20 Claims, 5 Drawing Sheets

High Refractive Index Layer
Low Refractive Index Layer

300

306    302    306
  304      304

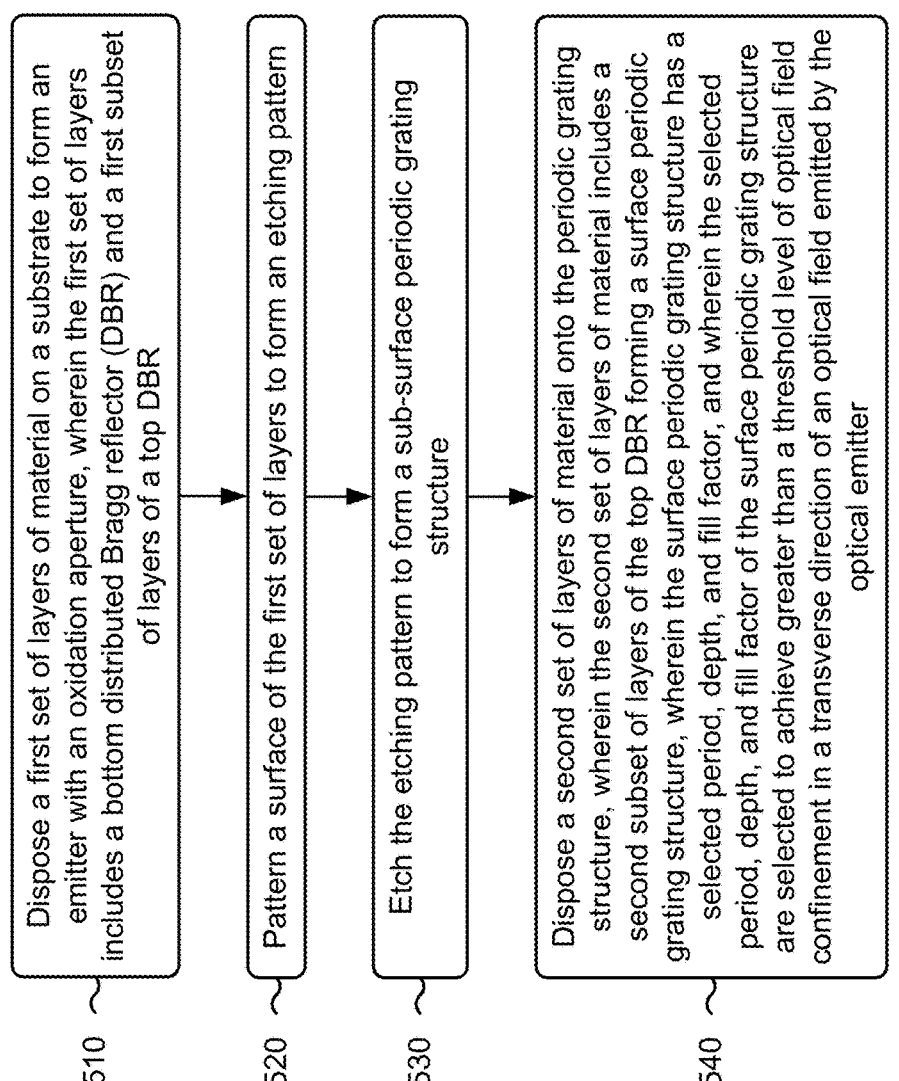

500

510  Dispose a first set of layers of material on a substrate to form an emitter with an oxidation aperture, wherein the first set of layers includes a bottom distributed Bragg reflector (DBR) and a first subset of layers of a top DBR 520  Pattern a surface of the first set of layers to form an etching pattern 530  Etch the etching pattern to form a sub-surface periodic grating structure 540  Dispose a second set of layers of material onto the periodic grating structure, wherein the second set of layers of material includes a second subset of layers of the top DBR forming a surface periodic grating structure, wherein the surface periodic grating structure has a selected period, depth, and fill factor, and wherein the selected period, depth, and fill factor of the surface periodic grating structure are selected to achieve greater than a threshold level of optical field confinement in a transverse direction of an optical field emitted by the optical emitter

FIG. 5

STACKED GRATINGS FOR OPTICAL EMITTERS

CROSS-REFERENCE TO RELATED APPLICATION

This Patent Application claims priority to U.S. Provisional Patent Application No. 63/367,882, filed on Jul. 7, 2022, and entitled "STACKED GRATINGS FOR OPTICAL EMITTERS." The disclosure of the prior Application is considered part of and is incorporated by reference into this Patent Application.

TECHNICAL FIELD

The present disclosure relates generally to stacked gratings and to an optical emitter with a stacked grating.

BACKGROUND

An optical emitter, such as a top-emitting vertical cavity surface-emitting laser (VCSEL), a bottom-emitting VCSEL, or an edge emitter, among other examples, may generate a set of modes during emission, such as a fundamental mode and one or more non-fundamental modes. Some or all of the non-fundamental modes may be referred to as "undesired modes." When the undesired modes propagate from the optical emitter (along with the fundamental mode), the undesired modes may impact an optical performance of an optical system that includes the optical emitter. For example, the presence of undesired modes may affect an intensity of an optical beam, a phase noise of the optical beam, a beam quality of the optical beam, or a side mode suppression ratio (SMSR) of the optical beam, among other examples.

SUMMARY

In some implementations, an optical device includes an optical emitter, and an optical element aligned to the optical emitter, wherein the optical element includes: an oxidation aperture; one or more distributed Bragg reflectors (DBRs) disposed on the oxidation aperture; and a stacked periodic grating structure disposed on the one or more DBRs, wherein the stacked periodic grating structure includes a set of layers, wherein the set of layers includes alternating layers of a first material and a second material, wherein the stacked periodic grating structure has a selected period, depth, and fill factor, wherein the selected period, depth, and fill factor of the stacked periodic grating structure are selected to achieve greater than a threshold level of optical field confinement in a transverse direction of an optical field emitted by the optical emitter.

In some implementations, a method includes disposing a first set of layers of material on a substrate to form an emitter with an oxidation aperture, wherein the first set of layers includes a bottom DBR and a first subset of layers of a top DBR; patterning a surface of the first set of layers to form an etching pattern; etching the etching pattern to form a sub-surface periodic grating structure; and disposing a second set of layers of material onto the periodic grating structure, wherein the second set of layers of material includes a second subset of layers of the top DBR forming a surface periodic grating structure, wherein the surface periodic grating structure has a selected period, depth, and fill factor, and wherein the selected period, depth, and fill factor of the surface periodic grating structure are selected to achieve greater than a threshold level of optical field confinement in a transverse direction of an optical field emitted by the optical emitter.

In some implementations, an optical element includes an oxidation aperture; one or more DBRs disposed on the oxidation aperture; and a stacked periodic grating structure formed between a first subset of layers of the one or more DBRs and a second subset of layers of the one or more DBRs, wherein the stacked periodic grating structure has a selected period, depth, and fill factor, wherein the selected period, depth, and fill factor of the stacked periodic grating structure are selected to achieve greater than a threshold level of optical field confinement in a transverse direction of an optical field emitted by the optical emitter.

BRIEF DESCRIPTION OF THE DRAWINGS

FIG. 5 is a flowchart of an example process associated with manufacturing stacked gratings for optical emitters.

DETAILED DESCRIPTION

The following detailed description of example implementations refers to the accompanying drawings. The same reference numbers in different drawings may identify the same or similar elements.

Mode competition in an optical beam, between a fundamental mode and other modes (e.g., non-fundamental or undesired modes), may impact performance of an optical system using the optical beam. For example, mode competition may reduce communication performance, measurement accuracy, three-dimensional (3D) imaging performance, or gesture recognition performance, among other examples. To reduce mode competition, an oxidation aperture size of an optical emitter can be reduced, which can limit undesired modes from propagating beyond an oxidation aperture of an optical emitter. However, reducing the oxidation aperture size of the optical emitter may result in an increase in current or power density of the optical emitter, which may also impact performance of the optical emitter and the optical system.

A distributed Bragg reflector (DBR) structure may be provided with an optical emitter to control or confine mode propagation in a vertical direction without restricting an oxidation aperture size. However, the DBR structure may not confine undesired modes in a transverse direction. In this case, when using DBR structures, transverse modes remain limited by the oxidation aperture size and shape. Accordingly, it is desirable for an optical emitter to achieve mode control in a transverse direction without restricting an oxidation aperture size or shape.

Some implementations described herein provide a stacked grating to enable mode control for an optical emitter. For example, the stacked grating is configured with a duty cycle, etching depth, and/or grating period to provide modal discrimination of transverse modes and suppression of undesired modes to below a lasing threshold (e.g., while maintaining a fundamental mode). In this way, the stacked grating provides for single-transverse-mode operation. Additionally, or alternatively, the optical emitter may include a set of DBR structures that control mode propagation in a vertical direction. In this case, based on controlling mode propagation in the transverse direction and the vertical direction, the optical emitter achieves single mode operation. In some implementations, the stacked grating enables single-mode lasing without restricting an oxidation aperture size or shape. Moreover, based on achieving single mode operation, the optical emitter achieves polarization control, which may enable use of the optical emitter for 3D sensing applications, among other examples.

Figures 1A, 1B:
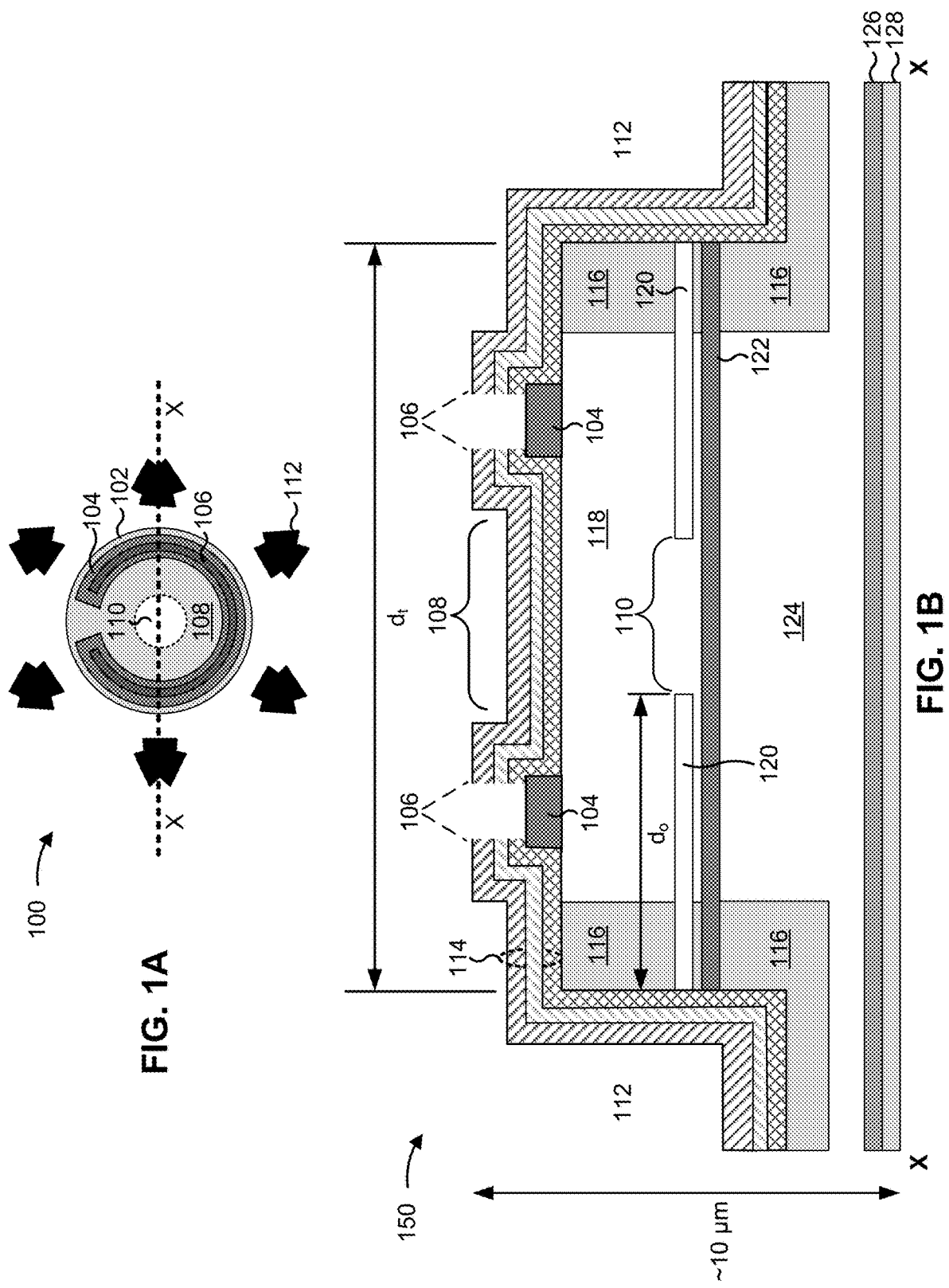
FIGS. 1A and 1B are diagrams depicting an example optical emitter.

FIGS. 1A and 1B are diagrams depicting a top-view of an example optical emitter 100 and a cross-sectional view 150 of example optical emitter 100 along the line X-X, respectively. As shown in FIG. 1A, optical emitter 100 may include a set of optical emitter layers constructed in an optical emitter architecture. In some implementations, optical emitter 100 may correspond to one or more vertical-emitting devices, such as VCSELs, oxide-confided VCSELs, implant-only VCSELs, mesa-type VCSELs, as described herein. Although optical emitter 100 is described as a vertical-emitting device, it is contemplated that edge-emitting devices may also be used with some implementations described herein.

As shown in FIG. 1A, optical emitter 100 may include an implant protection layer 102 that is circular in shape. In some implementations, implant protection layer 102 may have another shape, such as an elliptical shape, a polygonal shape, or the like. Implant protection layer 102 is defined based on a space between sections of implant material (not shown) included in optical emitter 100.

As shown in FIG. 1A, optical emitter 100 includes an ohmic metal layer 104 (e.g., a P-Ohmic (or "p-type ohmic") metal layer or an N-Ohmic (or "n-type ohmic") metal layer) that is constructed in a partial ring-shape (e.g., with an inner radius and an outer radius). A first area of ohmic metal layer 104 is covered by a protective layer (e.g., a dielectric layer or a passivation layer) of optical emitter 100 and a second area of ohmic metal layer 104 is exposed by via 106, described below. As shown, ohmic metal layer 104 overlaps with implant protection layer 102. Such a configuration may be used, for example, in the case of a P-up/top-emitting optical emitter 100. In the case of a bottom-emitting optical emitter 100, the configuration may be adjusted as needed.

Not shown in FIG. 1A, optical emitter 100 includes a protective layer in which via 106 is formed (e.g., etched). The second area of ohmic metal layer 104 is exposed by via 106 (e.g., the shape of the dark gray area may be a result of the shape of via 106), while the first area of ohmic metal layer 104 is covered by some protective layer. The protective layer may cover all of the optical emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, optical emitter 100 includes an optical aperture 108 in a portion of optical emitter 100 within the inner radius of the partial ring-shape of ohmic metal layer 104. Optical emitter 100 emits a laser beam via optical aperture 108. As further shown, optical emitter 100 also includes a current confinement aperture 110 (e.g., an "oxide aperture" or "oxidation aperture" formed by an oxidation layer of optical emitter 100 (not shown)). Current confinement aperture 110 is formed below optical aperture 108.

As further shown in FIG. 1A, optical emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, optical emitter 100 may include additional layers, fewer layers, different layers, or differently arranged layers than those shown in FIG. 1A. For example, while optical emitter 100 includes a set of six trenches 112, in practice, other configurations are possible, such as a compact optical emitter that includes five trenches 112, seven trenches 112, or another quantity of trenches. In some implementations, trench 112 may encircle optical emitter 100 to form a mesa structure dt. As another example, while optical emitter 100 is a circular optical emitter design, in practice, other designs may be used, such as a rectangular optical emitter, a hexagonal optical emitter, an elliptical optical emitter, or the like. Additionally, or alternatively, a set of layers (e.g., one or more layers) of optical emitter 100 may perform one or more functions described as being performed by another set of layers of optical emitter 100, respectively.

Notably, while the design of optical emitter 100 is described as including a VCSEL, other implementations are possible. For example, the design of optical emitter 100 may apply in the context of another type of optical device, such as a light emitting diode (LED), or another type of vertical emitting (e.g., top emitting or bottom emitting) optical device. Additionally, the design of optical emitter 100 may apply to optical emitters of any wavelength, power level, and/or emission profile. In other words, optical emitter 100 is not particular to an optical emitter with a given performance characteristic.

As shown in FIG. 1B, the example cross-sectional view may represent a cross-section of optical emitter 100 that passes through, or between, a pair of trenches 112 (e.g., as shown by the line labeled "X-X" in FIG. 1A). As shown, optical emitter 100 may include a backside cathode layer 128, a substrate layer 126, a bottom mirror 124, an active region 122, an oxidation layer 120, a top mirror 118, an implant isolation material 116, a protective layer 114 (e.g. a dielectric passivation/mirror layer), and an ohmic metal layer 104. As shown, optical emitter 100 may have, for example, a total height that is approximately 10 μm.

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a GaAs layer, an InP layer, and/or another type of semiconductor layer.

Bottom mirror 124 may include a bottom reflector layer of optical emitter 100. For example, bottom mirror 124 may include a distributed Bragg reflector (DBR).

Active region 122 may include a layer that confines electrons and defines an emission wavelength of optical emitter 100. For example, active region 122 may be a quantum well.

Oxidation layer 120 may include an oxide layer that provides optical and electrical confinement of optical emitter 100. In some implementations, oxidation layer 120 may be formed as a result of wet oxidation of an epitaxial layer. For example, oxidation layer 120 may be an Al2O3 layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround optical emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of optical emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like. As described in more detail herein, current confinement aperture 110 may be aligned to a stacked grating structure, which may provide mode confinement for the optical emitter 100.

Top mirror 118 may include a top reflector layer of optical emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a SiO2 layer, a Si3N4 layer, an Al2O3 layer, or other layers) deposited (e.g., by chemical vapor deposition, atomic layer deposition, or other techniques) on one or more other layers of optical emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the optical emitters and is well within the knowledge of a person skilled in the art. Ohmic metal layer 104 may provide ohmic contact between a metal and a semiconductor and/or may provide a non-rectifying electrical junction and/or may provide a low-resistance contact.

In some implementations, optical emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B is provided as an example. In practice, optical emitter 100 may include additional layers, fewer layers, different layers, differently constructed layers, or differently arranged layers than those shown in FIG. 1B. Additionally, or alternatively, a set of layers (e.g., one or more layers) of optical emitter 100 may perform one or more functions described as being performed by another set of layers of optical emitter 100 and any layer may comprise more than one layer.

Figure 2:
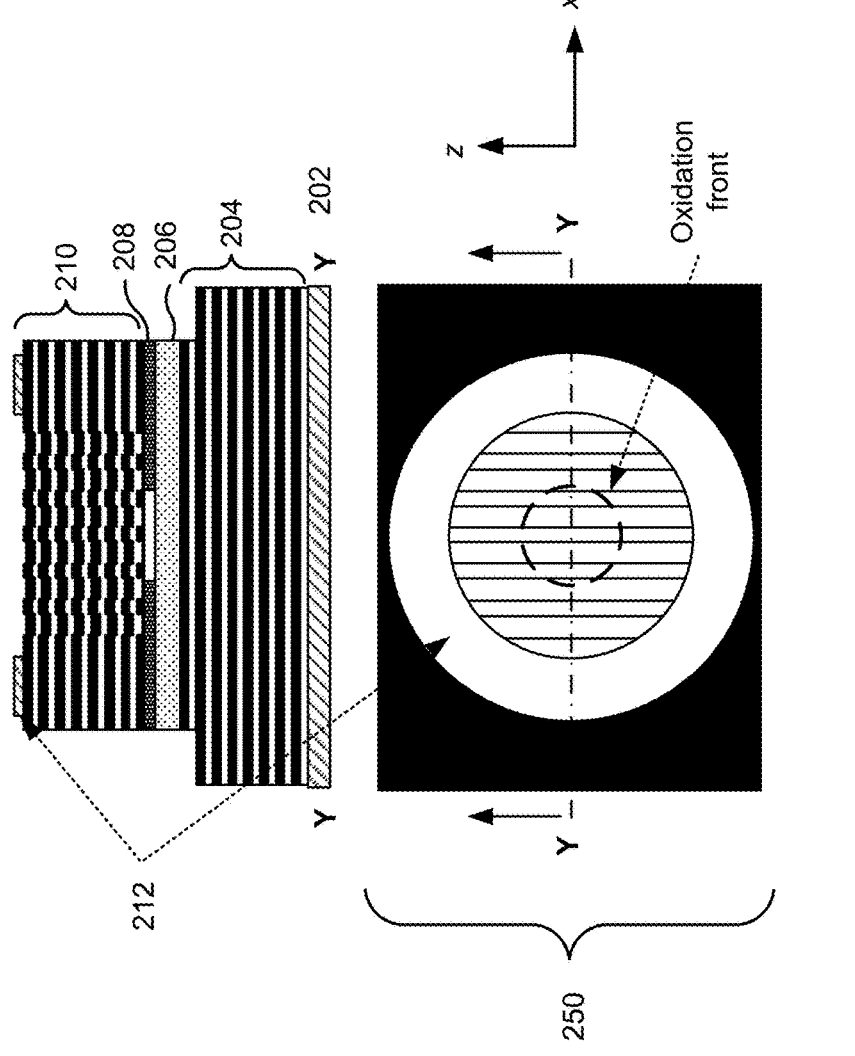
FIG. 2 is a diagram of an example implementation of a stacked grating for an optical emitter.

FIG. 2 is a diagram of an example implementation of an optical device 200 associated with stacked gratings for optical emitters. As shown in FIG. 2, and by the cross-section Y-Y, optical device 200 includes an N-plating metal (NPLT) structure 202, a first set of layers 204, a quantum well structure 206, an oxidation aperture 208, a second set of layers 210, and a p-ohmic metal (POM) structure 212.

In some implementations, the optical device 200 may be an optical emitter, such as a VCSEL, an oxide-confined VCSEL, an implant-only VCSEL, a mesa-type VCSEL, a top-emitting VCSEL, or a bottom-emitting VCSEL, among other examples. Additionally, or alternatively, the optical device 200 may be an edge-emitter, a light emitting diode, or another type of optical emitter. In some implementations, the optical device 200 may be included in an optical system, such as an optical communication system, a gesture recognition system, a ranging system, or a 3D imaging system, among other examples.

The NPTL structure 202 may be an epitaxial wafer onto which the first set of layers 204 is disposed to form one or more bottom DBRs. In some implementations, the NPTL structure 202 may be a gallium arsenide (GaAs) substrate or an indium phosphide (InP) substrate. The one or more bottom DBRs may include alternating layers of a first material and a second material. For example, the first set of layers 204 may include one or more first layers of a relatively high refractive index material and one or more layers of a relatively low refractive index material (e.g., the relatively high refractive index material has a higher refractive index than the relatively low refractive index material). In some implementations, the first set of layers 204 may include one or more metallic layers (e.g., an aluminum, gold, or copper layer), one or more oxide layers (e.g., a silicon dioxide, titanium dioxide, or tantalum oxide layer), or one or more dielectric material layers, among other examples. In some implementations, the first set of layers 204 and/or other layers described herein may be formed from one or more thin film layers. Additionally, or alternatively, the first set of layers 204 and/or other layers described herein (e.g., layers forming a periodic stacked grating structure) may be formed from other types of periodic structures, photonic crystals, or meta-surfaces, among other examples.

The quantum well structure 206 and an associated active region of the optical device 200 are disposed onto the one or more bottom DBRs formed from the first set of layers 204. In some implementations, the second set of layers 204 may include a first one or more top DBRs, a periodic stacked grating structure, and/or a second one or more top DBRs. In some implementations, the second one or more top DBRs may form the periodic stacked grating structure. For example, as described in more detail herein, a lithography and wet chemical etching process may be used to form a periodic structure from a first one or more layers, and a second one or more layers may be deposited onto the periodic structure of the first one or more layers. In this case, the second one or more layers may have the periodic structure of the first one or more layers. In other words, a first one or more top DBR pairs may be patterned to form a patterned periodic grating structure, and a second one or more top DBR pairs may be deposited onto the patterned periodic grating structure. Based on the second one or more top DBR pairs being deposited onto the patterned periodic grating structure, the second one or more top DBR pairs are formed with the patterned periodic grating structure. This obviates a need for deep etching from a top surface.

In some implementations, the oxidation aperture 208 may have a particular shape. For example, the oxidation aperture 208 may have a circular shape or an oval shape. Other shapes are also contemplated. In some implementations, the oxidation aperture 208 may have greater than a threshold size. For example, the oxidation aperture 208 may be larger than 100 micrometers. In some implementations, the second set of layers 210 is formed from a set of alternating layers. For example, the second set of layers 210 may have alternating relatively low refractive index layers and relatively high refractive index layers. As described above, the relatively low refractive index layers and/or the relatively high refractive index layers may be formed from metal layers, oxide layers, dielectric layers, or thin film layers, among other examples.

As further shown in FIG. 2, and by reference number 250 in a top-down view, the periodic stacked grating structure is periodic with regard to a first axis. For example, the periodic stacked grating structure is periodic across the cross-section of the optical device 200. For example, the stacks vary along an x-axis but are uniform along a z-axis, as shown. For example, the periodic stacked grating structure can confine optical modes of an optical beam emitted by the optical device 200 in a single direction. This enables transverse mode control for the optical device 200 without deep etching or restricting a size of an oxidation aperture.

As indicated above, FIG. 2 is provided as an example. Other examples may differ from what is described with regard to FIG. 2.

Figure 3:
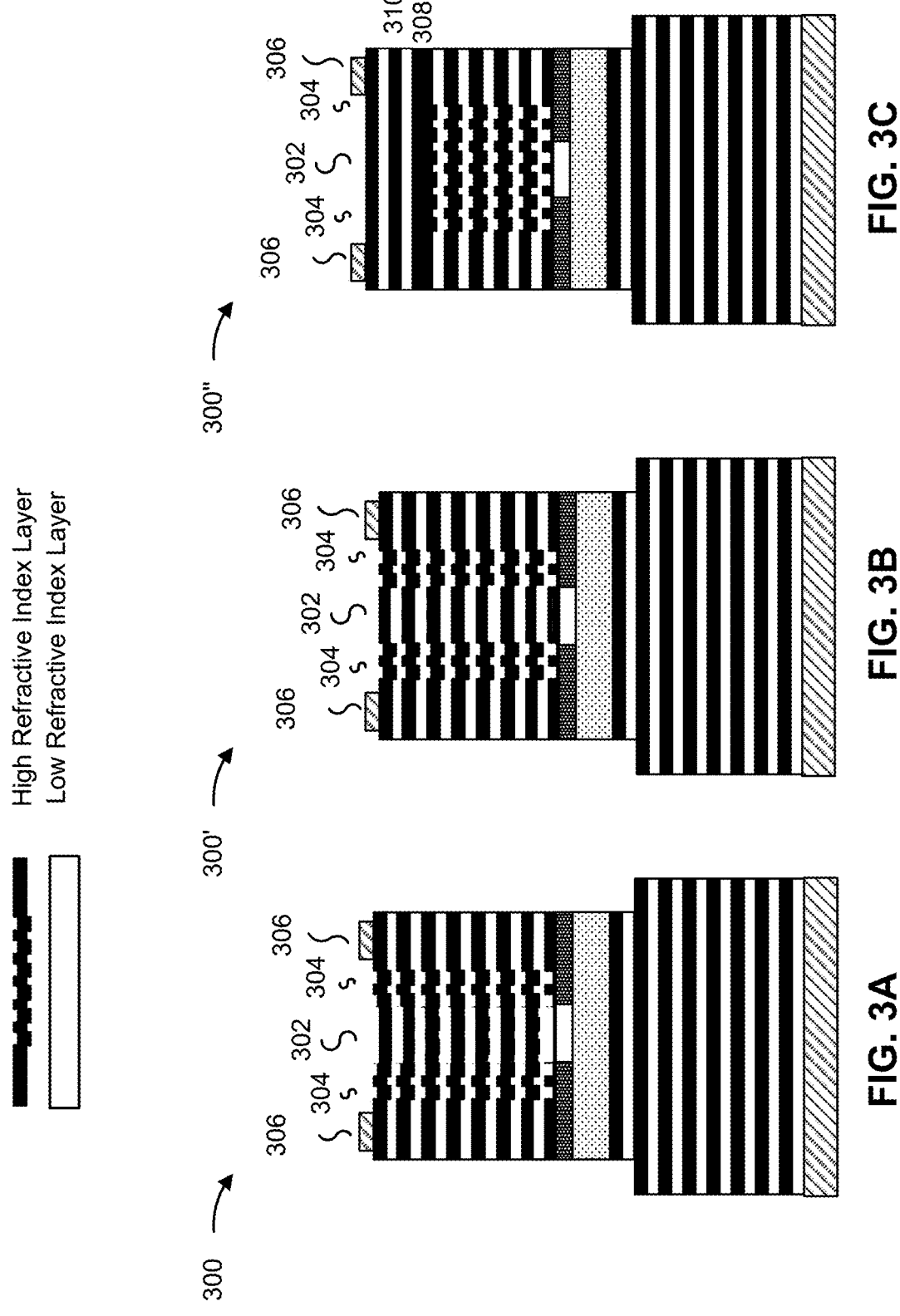
FIGS. 3A-3C are diagrams of example implementations of stacked gratings for optical emitters.

FIGS. 3A-3C are diagrams of example implementations 300/300'/300" associated with stacked gratings for optical emitters.

As shown in FIG. 3A, a periodic stacked grating structure 300 includes a first section 302, a second section 304, and a third section 306. The first section 302 is disposed over an oxidation aperture of an optical emitter. The third section 306 is disposed under a surface p-ohmic metal structure of the optical emitter. The second section 304 is disposed between the first section 302 and the third section 306. In FIG. 3A, the first section 302 and the third section 306 are uniform, but the second section 304 includes a set of stacks and gaps. Although the sections 302/304/306 are described separately, the sections 302/304/306 form a single periodic stacked grating structure with, as shown in FIG. 3A, a non-uniform width to the stacks and gaps. In other words, in FIG. 3A, first section 302 is a single gap, second section 304 includes two stacks and two gaps on either side of the first section 302, and third section 306 is a single stack on either side of the second sections 304. Accordingly, the periodic stacked grating structure 300 can be said to have 6 stacks and 5 gaps, as shown. Additional quantities and arrangements are contemplated.

As further shown in FIG. 3A, the periodic stacked grating structure results in a top of the stacks of the second section 304 aligning to a top surface of the third section 306 and a bottom of the gaps of section 304 aligning to a bottom surface of the first section 302. In other words, high refractive index layers of the first section 302 are offset from high refractive index layers of the third section 306 vertically, and high refractive index layers of the second section 304 alternate between a vertical position of the high refractive index layers of the first section 302 and a vertical position of the high refractive index layers of the third section 306.

In contrast, as shown in FIG. 3B, the first section 302 is aligned to the third section 306. In this case, the high refractive index layers of the second section 304 alternate between being in alignment with and being offset from high refractive index layers of the first section 302 and the third section 306. FIG. 3C shows another configuration of the periodic stacked grating. In FIG. 3C, the first section 302 and the second section 304 are merged into a single uniform set of stacks and gaps, and the third section 306 surrounds the merged first section 302 and second section 304 with a pair of stacks. Additionally, as shown in FIG. 3C, a high refractive index layer 308 is disposed on top of the periodic stacked grating structure and a set of uniform alternating layers 310 is disposed on top of the high refractive index layer 308. In this case, layers 308 and 310 may be one or more additional top DBRs, a protective layer (e.g., to reduce wear on the periodic stacked grating structure), a filter layer (e.g., a bandpass filter to control a wavelength that is emitted beyond the periodic stacked grating structure), a lens (e.g., to focus an emitted optical beam), or another type of optical element.

In some implementations, the periodic stacked grating structures may have periods, depths, and/or fill factors selected to achieve greater than a threshold level of optical field confinement in a transverse direction of an optical field emitted by an optical emitter. For example, as shown in FIG. 3A, different periods (e.g., horizontal widths of stacks and gaps) may be used for the periodic stacked grating structures to control transverse modes. The threshold level of optical field confinement (and/or the threshold quantum cavity size or threshold mode volume described herein) may be achieved at a particular wavelength for which an optical device that includes the periodic stacked grating structure is configured. For example, the threshold level of optical field confinement may be achieved in a range of 900 nanometers (nm) to 1550 nm. The period, depth, and/or fill factor may be selected to confine optical modes in the particular range for which the periodic stacked grating structure is to be used. In other words, an optical device may have a periodic stacked grating structure with a first period, depth, and/or fill factor when used for a first wavelength range, a first amount of power, a first quantity of DBRs, or a first oxidation aperture size, among other examples, and may have a second period, depth, and/or fill factor when used for a second wavelength range, a second amount of power, a second quantity of DBRs, or a second oxidation aperture size.

In some implementations, the period may be constant across the periodic stacked grating structure or may vary across the periodic stacked grating structure. For example, the periodic stacked grating structure may have a first period (e.g., stacks with a first width) in a first section and a second period (e.g., stacks with a second width) in a second section. Additionally, or alternatively, the periodic stacked grating structure may have patterns of stacks with a plurality of widths, where the pattern differs in different sections or across a single section. Similarly, the depth (e.g., a height difference between a surface of a stack and a surface of a gap) may be constant throughout the periodic stacked grating or may vary across or within sections to control undesired modes. Similarly, the fill factor (e.g., a relative width of a section that is a stack or gap) may be constant across the periodic stacked grating structure, or multiple fill factors may be present at multiple sections of the periodic stacked grating structure. In this way, by varying the period, depth, or fill factor, among other examples, a threshold quantum cavity size or a threshold mode volume can be achieved for an optical emitter, thereby controlling transverse modes and/or achieving polarization control.

As indicated above, FIGS. 3A-3C are provided as examples. Other examples may differ from what is described with regard to FIGS. 3A-3C.

Figure 4:
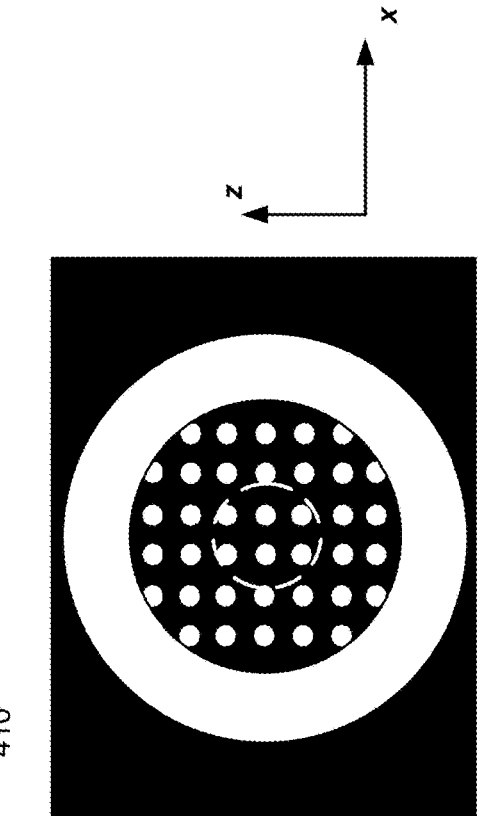
FIG. 4 is a diagram of an example implementation of a stacked grating for an optical emitter.

FIG. 4 is a diagram of an example implementation 400 associated with stacked gratings for optical emitters. As further shown in FIG. 4, a periodic stacked grating structure 410 is periodic with regard to a first axis (x) and with regard to a second axis (z) that is orthogonal to the first axis. This is in contrast to the optical device 200 of FIG. 2 that is periodic with regard to the first axis, but not the second axis, as shown. In some implementations, the periodic stacked grating structure 410 includes a set of shaped pillars and troughs to achieve a periodic shape with regard to two axes. For example, as shown, the set of pillars may have a circular shape and the troughs may be formed around the circular shaped pillars. It is contemplated that the periodic stacked grating structure 410 is associated with another shape, such as an oval-shaped pillar, a square-shaped pillar, or a rectangle-shaped pillar. Additionally, or alternatively, it is contemplated that the periodic stacked grating structure 410 is associated with shaped troughs, with pillars formed around the shaped troughs. For example, periodic stacked grating structure 410 may include circle-shaped troughs, oval-shaped troughs, square-shaped troughs, or rectangle-shaped troughs, among other examples. In this way, the periodic stacked grating structure can confine optical modes of an optical beam emitted by the optical device 200 in a single direction.

As indicated above, FIG. 4 is provided as an example. Other examples may differ from what is described with regard to FIG. 4.

FIG. 5 is a flowchart of an example process 500 associated with stacked gratings for optical emitters. In some implementations, one or more process blocks of FIG. 5 are performed by a device (e.g., a manufacturing device, a lithography device, a wet chemical etching device, or a deposition device, among other examples).

As shown in FIG. 5, process 500 may include disposing a first set of layers of material on a substrate to form an emitter with an oxidation aperture, wherein the first set of layers includes a bottom DBR and a first subset of layers of a top DBR (block 510). For example, the device may dispose a first set of layers of material on a substrate to form an emitter with an oxidation aperture, wherein the first set of layers includes a bottom DBR and a first subset of layers of a top DBR, as described above. In some implementations, the first set of layers includes a bottom DBR and a first subset of layers of a top DBR.

As further shown in FIG. 5, process 500 may include patterning a surface of the first set of layers to form an etching pattern (block 520). For example, the device may pattern a surface of the first set of layers to form an etching pattern, as described above.

As further shown in FIG. 5, process 500 may include etching the etching pattern to form a sub-surface periodic grating structure (block 530). For example, the device may etch the etching pattern to form a sub-surface periodic grating structure, as described above.

As further shown in FIG. 5, process 500 may include disposing a second set of layers of material onto the periodic grating structure, wherein the second set of layers of material includes a second subset of layers of the top DBR forming a surface periodic grating structure, wherein the surface periodic grating structure has a selected period, depth, and fill factor, and wherein the selected period, depth, and fill factor of the surface periodic grating structure are selected to achieve greater than a threshold level of optical field confinement in a transverse direction of an optical field emitted by the optical emitter (block 540). For example, the device may dispose a second set of layers of material onto the periodic grating structure, as described above. In some implementations, the second set of layers of material includes a second subset of layers of the top DBR forming a surface periodic grating structure. In some implementations, the surface periodic grating structure has a selected period, depth, and fill factor. In some implementations, the selected period, depth, and fill factor of the surface periodic grating structure are selected to achieve greater than a threshold level of optical field confinement in a transverse direction of an optical field emitted by the optical emitter.

Process 500 may include additional implementations, such as any single implementation or any combination of implementations described below and/or in connection with one or more other processes described elsewhere herein.

In a first implementation, process 500 includes fabricating an optical emitter aligned to the oxidation aperture.

In a second implementation, alone or in combination with the first implementation, the first set of layers and the second set of layers include alternating layers of a first material and a second material.

In a third implementation, alone or in combination with one or more of the first and second implementations, the first set of layers forms at least one of an active region or a high aluminum content layer for the oxidation aperture.

In a fourth implementation, alone or in combination with one or more of the first through third implementations, disposing the second set of layers comprises disposing the second set of layers using a molecular-beam epitaxy process or a metal organic chemical vapor phase deposition process.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical device, comprising:
an optical emitter; and
an optical element aligned to the optical emitter,
wherein the optical element includes:
an oxidation aperture;
one or more distributed Bragg reflectors (DBRs) disposed on the oxidation aperture; and
a stacked periodic grating structure disposed on the one or more DBRs, wherein the stacked periodic grating structure includes a set of layers, wherein the set of layers includes alternating layers of a first material and a second material,
wherein the stacked periodic grating structure has a selected period, depth, and fill factor,
wherein the selected period, depth, and fill factor of the stacked periodic grating structure are selected to achieve greater than a threshold level of optical field confinement in a transverse direction of an optical field emitted by the optical emitter, and
wherein the stacked periodic grating structure comprises a plurality of portions having stacks and gaps of non-uniform width, wherein vertical alignment of high refractive index layers varies among the plurality of portions.

2. The optical device of claim 1,
wherein a section of the plurality of portions of the stacked periodic grating structure is periodic along a first axis.

3. The optical device of claim 1,
wherein a section of the plurality of portions of the stacked periodic grating structure is periodic along a first axis and along a second axis that is orthogonal to the first axis.

4. The optical device of claim 1,
wherein the selected period, depth, and fill factor are selected to achieve a threshold quantum cavity size.

5. The optical of claim 1,
wherein the selected period, depth, and fill factor are selected to achieve less than a threshold mode volume.

6. The optical device of claim 1,
wherein the selected period is constant across the stacked periodic grating structure.

7. The optical device of claim 1,
wherein the selected period is a first period for a first portion of the plurality of portions and a second period for a second portion of the plurality of portions, and
wherein the first period is different from the second period.

8. The optical device of claim 1,
wherein the optical emitter includes at least one of:
a vertical cavity surface-emitting laser (VCSEL),
an oxide-confided VCSEL,
an implant-only VCSEL,
a mesa-type VCSEL,
a top-emitting VCSEL, or
a bottom-emitting VCSEL.

9. The optical device of claim 1,
wherein the oxidation aperture comprises a circle shape or an oval shape.

10. The optical device of claim 1,
wherein the optical device is formed on a substrate, and
wherein the substrate is a gallium arsenide (GaAs) substrate or an indium phosphide (InP) substrate.

11. The optical device of claim 1,
wherein the greater than the threshold level of optical field confinement is achieved at a wavelength range of at least 900 nanometers (nm) to 1550 nm.

12. The optical device of claim 1,
wherein the optical device is configured for single-transverse-mode operation.

13. A method, comprising:
disposing a first set of layers of material on a substrate to form an emitter with an oxidation aperture, wherein the first set of layers includes a bottom distributed Bragg reflector (DBR) and a first subset of layers of a top DBR;

patterning a surface of the first set of layers to form an etching pattern;

etching the etching pattern to form a sub-surface periodic grating structure; and disposing a second set of layers of material onto the sub-surface periodic grating structure, wherein the second set of layers of material includes a second subset of layers of the top DBR forming a surface periodic grating structure, wherein the surface periodic grating structure has a selected period, depth, and fill factor, wherein the selected period, depth, and fill factor of the surface periodic grating structure are selected to achieve greater than a threshold level of optical field confinement in a transverse direction of an optical field emitted by the optical emitter, and wherein the sub-surface periodic grating structure comprises a plurality of portions having stacks and gaps of non-uniform width, wherein vertical alignment of high refractive index layers varies among the plurality of portions.

14. The method of claim 13, further comprising:

fabricating an optical emitter aligned to the oxidation aperture.

15. The method of claim 13, wherein the first set of layers and the second set of layers include alternating layers of a first material and a second material.

16. The method of claim 13, wherein the first set of layers forms at least one of an active region or a high aluminum content layer for the oxidation aperture.

17. The method of claim 13, wherein disposing the second set of layers comprises:

disposing the second set of layers using a molecular-beam epitaxy process or a metal organic chemical vapor phase deposition process.

18. An optical element, comprising:

an oxidation aperture;

one or more distributed Bragg reflectors (DBRs) disposed on the oxidation aperture; and a stacked periodic grating structure formed between a first subset of layers of the one or more DBRs and a second subset of layers of the one or more DBRs, wherein the stacked periodic grating structure has a selected period, depth, and fill factor, wherein the selected period, depth, and fill factor of the stacked periodic grating structure are selected to achieve greater than a threshold level of optical field confinement in a transverse direction of an optical field emitted by the optical emitter, and wherein the stacked periodic grating structure comprises a plurality of portions having stacks and gaps of non-uniform width, wherein vertical alignment of high refractive index layers varies among the plurality of portions.

19. The optical element of claim 18, wherein the oxidation aperture is larger than a threshold size.

20. The optical element of claim 18, wherein optical element is configured to achieve polarization control for an emitter aligned to the optical element.

\*   \*   \*   \*   \*